United States Patent
Rothleitner et al.

(10) Patent No.: US 6,441,592 B1
(45) Date of Patent: Aug. 27, 2002

(54) METHOD FOR MEASUREMENT OF BACKUP POWER SUPPLY CAPACITANCE IN RESTRAINT CONTROL MODULE

(75) Inventors: Hubert Rothleitner; Michael Breunig, both of Villach (AT); Colm Peter Boran, Novi, MI (US); David James Tippy, Farmington Hills, MI (US); Myron Ihor Senyk, Rochester Hills, MI (US); Paul Mario Camilleri, Brownstown, MI (US); Ralf Kissling, Novi, MI (US); Timothy John Blind, Ann Arbor, MI (US); Vincent Colarossi, Dearborn Heights, MI (US)

(73) Assignees: Visteon Global Technologies, Inc.; Infineon Technologies AG (DE)

( * ) Notice: Subject to any disclaimer, the term of this patent is extended or adjusted under 35 U.S.C. 154(b) by 0 days.

(21) Appl. No.: 09/834,849

(22) Filed: Apr. 13, 2001

(51) Int. Cl.⁷ .......................... G05F 1/577; G01R 27/26
(52) U.S. Cl. ...................... 323/267; 323/285; 324/678; 320/167
(58) Field of Search ................. 323/222, 225, 323/259, 267, 282, 283, 284, 285, 344, 350, 351, 352; 320/166, 167; 307/109; 324/658, 684, 686, 678

(56) References Cited

U.S. PATENT DOCUMENTS

| | | | |
|---|---|---|---|
| 4,661,768 A | 4/1987 | Carusillo | 324/60 C |
| 5,073,757 A | 12/1991 | George | 324/677 |
| 5,274,334 A | 12/1993 | Mills | 324/678 |
| 5,399,980 A | 3/1995 | Rashford | 324/678 |
| 5,461,321 A | 10/1995 | Sanders et al. | 324/678 |
| 5,576,628 A | 11/1996 | Caliboso et al. | 324/678 |
| 5,982,604 A | * 11/1999 | Kojima et al. | 323/282 X |
| 6,194,885 B1 | * 2/2001 | Oshima | 323/285 |

* cited by examiner

Primary Examiner—Jessica Han
(74) Attorney, Agent, or Firm—Brinks Hofer Gilson & Lione

(57) ABSTRACT

A method and system for measuring the capacitance of a backup power source in a backup power supply system is disclosed by the present invention. The regulated output voltage is set to a nominal regulated output voltage during normal operation and then adjusted to a predetermined regulated output voltage during a capacitance measurement. A pair of predetermined loads is connected to the backup power source in consecutive order for discharging energy from the backup power source. A counter is used to count the time that elapses before the regulated output voltage reaches the lower regulated output voltage or the backup power supply system begins regulating. The resulting counts are used by a main control unit, together with several other known values, to determine the capacitance of the backup power source.

28 Claims, 2 Drawing Sheets

METHOD FOR MEASUREMENT OF BACKUP POWER SUPPLY CAPACITANCE IN RESTRAINT CONTROL MODULE

FIELD OF THE INVENTION

The present invention relates generally to circuits used to measure capacitance, and more particularly to a method for measuring the capacitance of a backup power supply in a restraint control module.

BACKGROUND OF THE INVENTION

Over the past several years, there has been a trend in the automotive industry to install air bag systems in vehicles to enhance protection traditionally afforded vehicle occupants through the use of seat belts. In some automotive vehicles, the inflatable restraint system may be an air bag system disposed within an occupant compartment in the automotive vehicle in close proximity to either a driver occupant or one or more passenger occupants. Usually, the air bag system includes a restraint control module that is connected to the vehicle structure and an air bag for deployment through an opening in a cover to extend and inflate in an occupant compartment of the automotive vehicle. The deployed air bag restrains movement of the occupant to protect the occupant from forcefully hitting parts of the automotive vehicle as a result of an automobile accident.

Air bag systems typically include a restraint control module, a reaction canister and an air bag and inflator that are stored inside the reaction canister. Generally speaking, the inflator is actuated by a signal received from a vehicle deceleration sensor or accelerometer that is connected to the restraint control module, which, in turn, causes a discharge of inflator gas into the interior of the air bag. The restraint control module controls the overall operation of the air bag system and essentially could be viewed as the main control unit for the air bag system.

As with any system based on electronic components and sensors, air bag systems and their associated electronic components, require power from a power supply in order to function properly. During normal operation, the power used to drive an air bag system and its related components originates from a battery that is located in the automotive vehicle. During some automotive accidents, the electrical conductors that connect the battery to the air bag system and its related electronic components may become severed or damaged so that power is cut off to these systems. As a result of the conductor being severed or damaged, the electronic components of the air bag system lose power and will not function properly due to the loss of power.

Due to this potential loss of power, a backup power supply for a restraint control module can be added to the air bag system that is capable of providing power during times in which the main power source is not capable of providing power. In the automotive setting, the backup power source will be required to operate over extended periods of time and over a wide range of operating conditions. As a result, a need exists to ensure that the backup power source is functioning in the system so that if needed, the backup power source will be capable of providing adequate power to deploy the air bags.

SUMMARY OF THE PRESENT INVENTION

The present invention discloses a method of measuring the capacitance of a backup power source in a backup power supply system using a capacitance measurement system. In the preferred embodiment of the present invention, during normal operation a regulated output voltage is generated by the backup power source and is set to a nominal regulated output voltage. Once set to the nominal regulated output voltage, the backup power supply system is adjusted by the capacitance measurement system to regulate the voltage provided by the backup power source to a predetermined regulated output voltage. In the preferred embodiment, the predetermined regulated output voltage is set 1 V below the nominal regulated output voltage. As set forth in the detailed description below, this is one of the values that is used by a main control unit to calculate the capacitance of the backup power source.

In addition to setting the regulated output voltage to the predetermined regulated output voltage, a first predetermined load is connected to the backup power source to dissipate energy that is stored in the backup power source. As the first predetermined load is connected to the backup power source, a counter is started that generates a first count value that corresponds to the amount of time that it takes for the backup power supply system to start regulating the regulated output voltage generated by the backup power source at the predetermined regulated output voltage. In the preferred embodiment, the backup power supply system is used to generate a regulated output voltage that is larger than its respective input voltage. The preferred nominal regulated output voltage and the predetermined regulated output voltage are also larger than the input voltage to the backup power supply system. As set forth in the detailed description, the change in voltage from the nominal regulated output voltage setting to the predetermined regulated output voltage setting is also used to calculate the capacitance of the backup power source.

Once the regulated output voltage reaches the predetermined regulated output voltage, the counter is stopped and the first count value is stored. Preferentially, the first count value is stored in a register that is connected to a main control unit; however, the first count value may also be stored in the main control unit in alternative embodiments. After the first count value is obtained, the regulated output voltage that is available on the backup power source is set back to the nominal regulated output voltage by the capacitance measurement system. Once the backup power source reaches the nominal regulated output voltage and is functioning properly, the backup power supply system is once again adjusted by the capacitance measurement system to regulate the voltage provided by the backup power source to the predetermined regulated output voltage. Next, a second predetermined load is connected to the backup power source to once again dissipate the energy stored in the backup power source.

As with the prior operation, the counter is also started to generate a second count value corresponding to the amount of time that it takes for the backup power supply system to start regulating the regulated output voltage generated by the backup power source at the predetermined regulated output voltage. Once the backup power supply system begins regulating at the predetermined regulated output voltage or in other words, reaches the predetermined regulated output voltage, the counter is stopped and the second count value is stored. As set forth in the detailed description, the second count value is also used to calculate the capacitance of the backup power source. Once the first count value and the second count value have been obtained, the capacitance of the backup power source is capable of being calculated by a main control unit.

In the preferred embodiment, a voltage set point circuit is used to adjust the backup power supply system to regulate the voltage provided by the backup power source to the predetermined regulated output voltage. The main control unit and a capacitance measurement control and status circuit are connected to the voltage set point circuit for controlling the voltage set point circuit. In the preferred embodiment, the main control unit is connected to a load select circuit that is used to connect the first and second predetermined loads to the backup power source during a capacitance measurement cycle. In addition, the capacitance measurement control and status circuit is connected to a state machine that controls the counter. An oscillator is connected to the state machine for driving the counter, the oscillator being set to a predetermined frequency that is also used in calculating the capacitance of the backup power source.

The first count value and the second count value are stored in a register that is connected to the main control unit and the output of the counter in the preferred embodiment of the present invention. The capacitance measurement system is also capable of being reset between measurements or counting cycles and in fact, in the preferred embodiment of the present invention the counter is reset after each counting cycle. However, those skilled in the art would recognize that the counter does not necessarily have to be reset after each counting cycle, such that, the last count is subtracted from the current count to obtain the actual count for each cycle. Those skilled in the art would recognize that the counter could be reset for various other reasons as well, such as when the counter experiences an overflow error.

A regulated output voltage sensor is connected to the backup power supply system and is used to generate a predetermined output signal that is used to stop the counter. In the preferred embodiment, the output of the regulated output voltage sensor is connected to the capacitance measurement and control circuit, which in turn, stops the counter upon receiving a predetermined output signal from the regulated output voltage sensor. The preferred regulated output voltage sensor comprises a reference voltage, a current source, a DMOS transistor and an inverter. For reasons set forth in detail below, in the preferred embodiment of the present invention the regulated output voltage sensor is connected to a boost converter switching device, which is used together with a backup power source charging circuit to regulate the voltage level present in the backup power source.

The capacitance measurement control and status circuit is capable of controlling the capacitance measurement system and providing a plurality of predetermined status signals to the main control unit. The main control unit continuously monitors the status of the capacitance measurement system during operation. In the preferred embodiment, the capacitance measurement control and status circuit is capable of notifying the main control unit that the capacitance measurement system is ready to begin taking a measurement, has experienced an error during a measurement and whether or not a measurement or count is underway, for example. The preferred capacitance measurement control and status circuit comprises a first OR gate, a first flip-flop, a first AND gate, a second AND gate, a second OR gate and a second flip-flop. Preferentially, the outputs of each flip-flop is used to generate status signals during operation of the capacitance measurement system, which are in turn added to the output of the counter as the two most significant bits of a 16-bit output signal.

Another embodiment of the present invention discloses a capacitance measurement system for a backup power supply system having a regulated backup power source that is capable of providing an adjustable regulated output voltage. The capacitance measurement system includes a voltage set point circuit that is connected to the backup power supply system for setting the backup power supply system to operate at a lower regulated output voltage than a nominal regulated output voltage. A capacitance measurement control and status circuit is connected to the voltage set point circuit for controlling operation of the voltage set point circuit. A counter is connected to the capacitance measurement control and status circuit, which is also controlled by the capacitance measurement control and status circuit.

A regulated output voltage sensor is connected to the backup power supply system for determining when the backup power source reaches the lower regulated output voltage during a capacitance measurement test. In the preferred embodiment, this is accomplished by monitoring when the backup power supply system begins regulating the output voltage on the backup power source in the preferred embodiment of the present invention. The preferred backup power supply system generates a regulated output voltage on the backup power source that is larger than its input voltage. In addition, the preferred predetermined regulated output voltage is less than the nominal regular output voltage.

During the capacitance measurement test, the backup power source is set to operate at a lower regulated output voltage than the nominal regulated output voltage by the voltage set point circuit. In addition, a first predetermined load is applied to the backup power source to lower the regulated output voltage from the nominal regulated output voltage to a predetermined lower regulated output voltage. The counter is started to generate a first count value that corresponds to the amount of time that it takes to lower the regulated output voltage from the nominal regulated output voltage to the lower regulated output voltage, at which point the backup power supply system begins regulating the backup power source to the lower regulated output voltage and the counter is deactivated by the signal from the regulated output voltage sensor. In the preferred embodiment, the output of the counter is stored in a register or some other equivalent memory storage device.

After the first count value is obtained, the backup power source is set to operate at the nominal regulated output voltage, which causes the backup power supply to boost the regulated output voltage back up to the nominal regulated output voltage. Once the nominal regulated output voltage is reached, the backup power source is once again set to operate at the lower regulated output voltage by the voltage set point circuit. At this point, a second predetermined load is applied to the backup power source to lower the regulated output voltage from the nominal regulated output voltage to the lower regulated output voltage. In addition, the counter is started to generate a second count value corresponding to the amount of time that it takes to lower the regulated output voltage from the nominal regulated output voltage to the lower regulated output voltage.

Once the regulated output voltage of the backup power service reaches the lower regulated output voltage, the counter is stopped with an output signal from the regulated voltage sensor. In the preferred embodiment, the regulated voltage sensor senses when the backup power supply system begins regulating the voltage on the backup power source to determine when the regulated output voltage reaches the lower regulation output voltage After the second count value has been obtained, the first count value and the second count value, together with several other known variables, can be used to calculate the capacitance of the backup power source of the backup power supply system.

Further objects and advantages of the present invention will be apparent from the following description, reference being made to the accompanying drawings wherein preferred embodiments of the present invention are clearly shown.

DETAILED DESCRIPTION OF THE DRAWINGS

DETAILED DESCRIPTION OF THE PRESENTLY PREFERRED EMBODIMENTS

Figure 1:
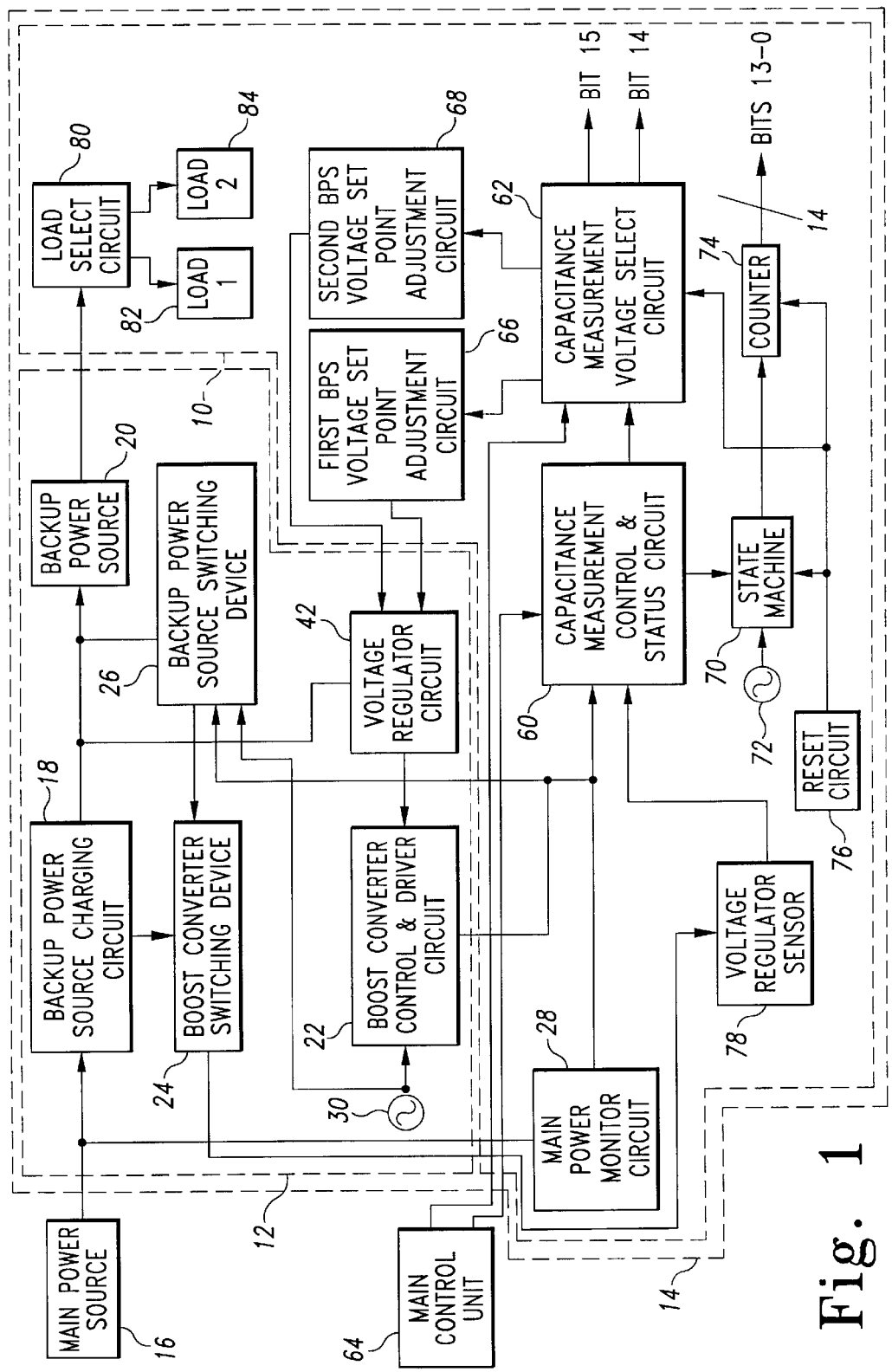
FIG. 1 illustrates a block diagram of a capacitance measurement system for a backup power supply system.

Referring to FIG. 1, a capacitance measurement system 10 for a backup power supply system 12 used in a restraint control module 14 is illustrated. In the preferred embodiment of the present invention, the capacitance measurement control system 10 is used to measure the capacitance of a backup power source 16 that is used in the backup power supply system 12. As set forth above, preferentially, the backup power supply system 12 is designed for use in a restraint control module 14; however, those skilled in the art would recognize that the present invention may be used in other systems as well.

In order to gain a better understanding of the present invention, the discussion below begins with a discussion of the preferred backup power supply system 12 and then sets forth a discussion of the preferred capacitance measurement system 10. Referring to FIG. 1, a preferred embodiment of the backup power supply system 12 for the restraint control module 14 is illustrated. The backup power supply system 12 includes a main power source 16 that is connected to a backup power source charging circuit 18 and a backup power source 20. During normal operation, the backup power source charging circuit 18 is used to initially charge and maintain a predetermined level of charge on the backup power source 20 that is connected to the output of the backup power source charging circuit 18. Further, although also not illustrated, the main power source 16 is also connected to the restraint control module 14 and provides power to various systems and components of the restraint control module 14 unless disconnected or taken out during an event experienced by the vehicle.

The charging of the preferred backup power source 18 is controlled by a boost converter control and driver circuit 22 that is connected to a boost converter switching device 24. The boost converter switching device 24 is also connected to the backup power source charging circuit 18. In the preferred embodiment, the boost converter control and driver circuit 22 is used to drive the boost converter switching device 24, which, in turn, causes the backup power source charging circuit 18 to charge and maintain a charge on the backup power source 20.

During normal operation, the boost converter control and driver circuit 22 controls the charging of the backup power source 20 to a predetermined voltage by switching the boost converter switching device 24 on and off at a predetermined time interval or duty cycle, thereby causing the backup power source charging circuit 18 to charge the backup power source 20. As such, when the boost converter switching device 24 is energized by an output pulse from the boost converter control and driver circuit 22 during normal operation, the boost converter switching device 24 causes the backup power source charging circuit 18 to deliver energy to and thus charge the backup power source 20.

As further illustrated in FIG. 1, in the preferred embodiment of the backup power supply system 12, a backup power source switching circuit 26 is connected to the boost converter and driver circuit 22 and the boost converter switching device 24. The backup power source switching circuit 26 is used to switch the source of power for the restraint control module 14 from the main power source 16 to the backup power source 20 in the event of a loss of power. The backup power source switching circuit 26 is also connected to the boost converter switching device 24 and the backup power source charging circuit 18. When a loss of power is experienced from the main power source 16, the boost converter control and driver circuit 22 stops energizing the boost converter switching device 24 and the backup power supply switching circuit 26 simultaneously transfers power to the restraint control module 14 from the main power source 16 to the backup power source 20.

In the preferred embodiment of the present invention, a main power monitoring circuit 28 is connected to the main power source 16, which continuously monitors the magnitude of voltage available on the main power source 16. The output of the main power monitoring circuit 28 is connected to the boost converter control and driver circuit 22 and the backup power source switching circuit 26. During normal power operation, the output of the main power monitoring circuit 28 causes the boost converter control and driver circuit 22 to operate in a charging mode, thereby initially charging and maintaining a charge on the backup power source 20. If a power loss is experienced from the main power source 16, the main power monitoring circuit 28 stops the boost converter control and driver circuit 22 from charging the backup power source 20 and causes the backup power source switching circuit 26 to transfer power from the main power source 16 to the backup power source 20.

As further illustrated in FIG. 1, an oscillator 30 is also connected with the boost converter control and driver circuit 20 and the backup power source switching circuit 26 for driving each respective circuit. During normal operation, the duty cycle of a rising saw tooth ramp that is generated by the oscillator 30 controls the duty cycle of the signal that is used to control the boost converter switching device 24. As previously set forth, the boost converter switching device 24 is used to control the backup power source charging circuit 18, which, in turn, charges the backup power source 20. Those skilled in the art would recognize that several other control inputs may be connected with the boost converter control and driver circuit 22 and the backup source switching circuit 26 to control the overall operation of the boost converter control and driver circuit 22 and the backup power source switching circuit 26.

Figure 2:
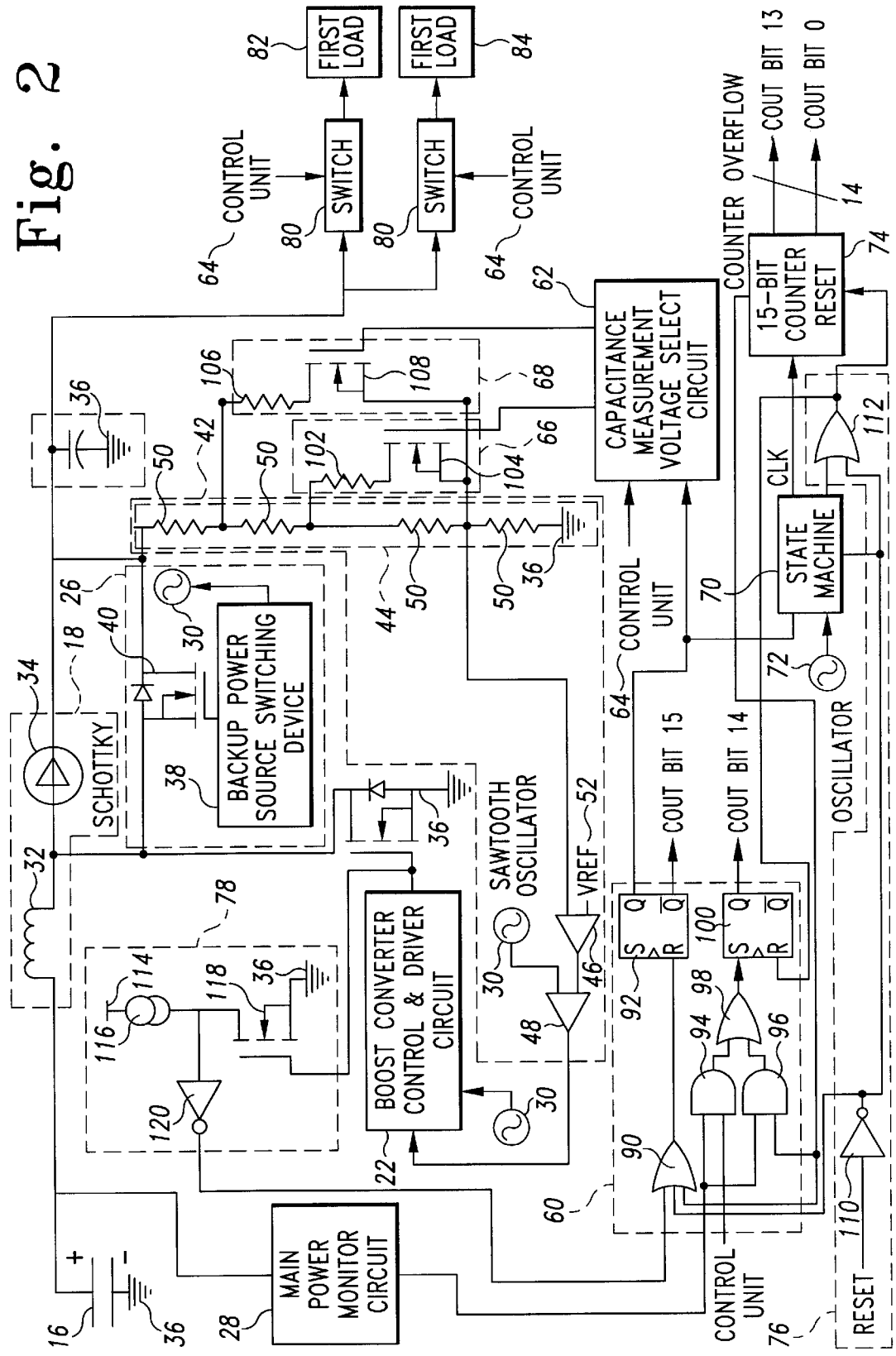
FIG. 2 depicts a detailed circuit schematic of the capacitance measurement system for the backup power supply system illustrated in FIG.

Referring to FIG. 2, a more detailed circuit diagram of the preferred backup power supply system 12 illustrated in FIG. 1 is set forth. In this embodiment, the main power source 16 is provided from the voltage present on an ignition terminal, which is commonly found in automobile electronic circuitry and powered from a battery. Generally speaking, when the automobile is running, there will be a predetermined voltage level present on the ignition terminal. In the preferred embodiment, the regulated output voltage generated on the backup power source 20 is adjustable to 33 V or 38 V in the backup power supply system 12, depending on the particular requirements needed by the restraint control module 14 to operate properly and the amount of voltage present on the ignition terminal.

As further illustrated in FIG. 2, the preferred backup power source charging circuit 18 comprises an inductor 32 and a Schottky diode 34. The inductor 32 is connected to the main power source 16 and the Schottky diode 34. The Schottky diode 34 is also connected to the backup power source 20. The boost converter switching device 24 is connected to the backup power source charging circuit 18 between inductor 32 and Schottky diode 34, as illustrated in FIG. 2. As such, during charging operations, the boost converter switching device 24 causes the inductor 32 to deliver current to the backup power source 20, thereby charging the backup power source 20 to a predetermined regulated output voltage.

As illustrated in FIG. 2, the preferred boost converter switching device 24 is a first DMOS transistor 24. The gate of the first DMOS transistor 24 is connected to the output of the boost converter control and driver circuit 22 and the drain of the first DMOS transistor 24 is connected to the backup power source charging circuit 18. The source of the first DMOS transistor 24 is connected to a ground connection 36. During normal operation, in which the voltage from the main power source 16 is sensed as being within a nominal ignition-voltage range, the inductor 32 is switched using pulse width modulation by the first DMOS transistor 24 to thereby charge the backup power source 20, which, in the preferred embodiment, comprises a second capacitor that preferentially does not exceed 4700 uF.

The preferred backup power supply system 12 works by shorting the inductor 32 across the voltage supplied by the main power source 16. This stores energy in the inductor 32. When the first DMOS transistor 24 is turned off, the inductor 32 is placed in series with the voltage supplied by the main power source 16 and the backup power source 20. As a result, the resulting voltage pulse generated by the inductor 32 is directed to the backup power source 20, which, as set forth above, comprises a capacitor. The Schottky diode 34 is used to keep the backup power source 20 from discharging during switching.

The capacitor that is used for the backup power source 20 is preferentially adequately sized to maintain power in the restraint control module 14 and other devices during a 150 ms battery drop out event. In the preferred embodiment, the boost converter control and driver circuit 22 is capable of charging the backup power source 20 to the maximum output voltage, which is 33 V or 38 V, within six seconds of power-up over the entire input-voltage range. The boost converter control and driver circuit 22 is connected to the backup power source switching circuit 26 so that each respective circuit is not operating at the same time. As such, when the boost converter control and driver circuit 22 is charging the backup power source 20, the backup power source switching circuit 26 is not energizing the backup power source 20 to provide power to the restraint control module 14.

As further illustrated in FIG. 2, the backup power source switching circuit 26 comprises a backup power source circuit and driver circuit 38 and a second DMOS transistor 40. The gate of the second DMOS transistor 40 is connected to the output of the backup power source control and driver circuit 38. The drain of the second DMOS transistor 40 is connected to the backup power source 20 and the source is connected to the drain of the first DMOS transistor 24. As such, when the backup power source control and driver circuit 40 senses a loss in power from the main power source 16, the second DMOS transistor 40 is energized by the backup power source control and driver circuit 38, thereby causing power to be transferred from the backup power source 20 to the restraint control module 14. Likewise, during this loss of power, the boost converter control and driver circuit 22 is not driving the boost converter switching device 24 and therefore the backup power source charging circuit 18 no longer charges the backup power source 20.

In the preferred embodiment, the voltage generated by the backup power source 20 is regulated by a voltage regulator circuit 42 that is connected to the backup power source 20 and the boost converter control and driver circuit 22. The preferred voltage regulator circuit 42 comprises a resistor divider chain 44, an error amplifier 46 and a pulse width modulation comparator 48. The last resistor 50 of the resister divider chain 44 is connected to the ground connection 36. The resistor divider chain 44 includes a plurality of resistors 50 that are connected to form a voltage divider, the output of which is connected to the input of error amplifier 46. The resistor divider chain 44 is preferentially designed for 33 V or 38 V operation, depending on the operating requirements of the vehicle. However, those skilled in the art should recognize that the disclosure of 33 V or 38 V is by way of example only and should not be construed as a limitation of the present invention. The output of the backup power source 20 is connected to the resistor divider chain 44 of the voltage regulator circuit 42 to generate the feedback signal provided to the error amplifier 46.

The error amplifier 46 compares a reference voltage 52 with the feedback voltage from the backup power source 20, which, as previously set forth, has been scaled down from the resistor divider chain 44. Using the pulse width modulation comparator 48, the output of the error amplifier 46 is compared with a periodic linear ramp that is provided by the saw tooth signal that is generated by the oscillator 30, which is also connected to the voltage regulator circuit 42. As a result, the pulse width modulation comparator 48 generates a logic signal with variable pulse widths, which is then passed to the boost converter control and driver circuit 22. The maximum duty cycle is determined by the duration of the rising ramp of oscillator 30. The first DMOS transistor 24 operates at the tuned frequency of the oscillator 30 and also features a maximum duty cycle limitation.

Referring to FIG. 1, a more detailed discussion of the preferred capacitance measurement system 10 is set forth below. As illustrated, the capacitance measurement system 10 includes a capacitance measurement control and status circuit 60 that is connected to a capacitance measurement voltage select circuit 62. The capacitance measurement control and status circuit 60 controls operation of the capacitance measurement system 10 and provides status information about the capacitance measurement system 10 during operation. For instance, the capacitance measurement control and status circuit 60 is capable of providing a signal that indicates that the capacitance measurement system 10 is counting, has lost power, is ready to take a measurement (ready signal), or an error signal that could possibly indicate a counter overflow or a loss of ignition power for example.

In the preferred embodiment, a main control unit 64 is connected to the capacitance measurement control and status circuit 60 and the capacitance measurement voltage select circuit 62. The main control unit 64 controls operation of the capacitance measurement system 12 and comprises a microprocessor that is used in an automobile in the preferred embodiment of the present invention. During operation, the main control unit 64 initiates a capacitance measurement of the backup power source 20 by sending respective signals to the capacitance measurement control and status circuit 60 and the capacitance measurement voltage select circuit 62, as set forth in greater detail below.

A first voltage set point circuit 66 and a second voltage set point circuit 68 are connected to the capacitance measurement voltage select circuit 62. In the preferred embodiment, the first voltage set point circuit 66 and the second voltage set point circuit 68 are connected to the voltage regulator circuit 42 of the backup power supply 12. As set forth above, the backup power supply system 12 is preferentially set to operate in either a 33 V or 38 V mode in the preferred embodiment of the present invention. Those skilled in the art should recognize that other voltage modes may be used and the use of 33 V or 38 V modes herein is by way of example only and should not be construed as a limitation of the present invention.

For reasons set forth in greater detail below, the first voltage set point circuit 66 is designed to cause the voltage regulator circuit 42 of the backup power supply system to regulate at 32 V if operating in 33 V mode and the second voltage set point circuit 68 is designed to cause the backup power supply system 12 to regulate at 37 V if operating in the 38 V mode. As such, the first and second voltage set point circuits 66, 68 are preferentially designed to drop the nominal regulated output voltage provided on the backup power source 20 to a predetermined lower regulated output voltage level. The use of two voltage levels is by way of example only and those skilled in the art would recognize that the capacitance measurement control and status circuit 60 might be directly connected with a respective voltage set point circuit 66, 68, thereby eliminating the need for the capacitance measurement voltage select circuit 62.

The capacitance measurement control and status circuit 60 is also connected to a state machine 70. An oscillator 72 is connected to the state machine 70 for providing input pulses to the state machine 70. The tuned frequency of the oscillator 72, which hereinafter will be referred to as $f_{fosc}$, is a value that is used to calculate the capacitance of the backup power source 20, which will be set forth in greater detail below. The state machine 70 is connected to a counter 74 and provides clock signals to the counter 74 during the capacitance measurement of the backup power source 20. As such, the state machine 74 controls operation of the counter 74. A reset circuit 76 is also connected to the state machine 70 and the counter 74 for resetting each respective element during operation, which may either be done by using software or hardware devices.

A regulated voltage sensor 78 is connected to the boost converter switching device 24 of the backup power supply system 12 and the capacitance measurement control and status circuit 60 of the capacitance measurement system 10. In the preferred embodiment, the regulated voltage sensor 78 is used to sense when the backup power supply system 10 begins regulating the voltage on the backup power source 20 at a predetermined regulated output voltage. Once the backup power supply system 12 begins regulating at the predetermined regulated output voltage, a signal is sent to the capacitance measurement control and status circuit 60 from the regulated voltage sensor 78 that causes the counter 74 to stop counting. Although not illustrated, in the preferred embodiment of the present invention the values of the counter 74 are stored in a predetermined memory location of a register or in a memory location of the main control unit 64. As such, although not illustrated, the outputs of the counter 74 may be connected to the main control unit 64.

A load select circuit 80 is connected to the backup power source 20, which in turn, is connected to a first predetermined load 82 and a second predetermined load 84. In the preferred embodiment of the present invention, the predetermined loads 82, 84 are defined diagnostic currents of the firing loop squibs (represented by $I_{basic}$, $I_{main}$) used in the restraint control module 14 in addition to unknown quiescent currents (represented by $I_q$) that are a function of the operating temperature of the restraint control module 14 and restraint control module 14 loading parameters that can be variable and must be pulled out. Those skilled in the art would recognize that other predetermined loads may be used in the present invention and that the use of these loads is by way of example only.

In order to determine the capacitance of the backup power source 20, a differential measurement is performed. Before a capacitance measurement is performed, the main control unit 64 measures the voltage level on the backup power source 20 to ensure proper regulation to either 33 V or 38 V in the preferred embodiment. Again, those skilled in the art would recognize that other regulated output voltage levels may be used. Next, the main control unit 64 causes the load select circuit 80 to connect the first predetermined load 82 to the backup power source 20 and also sends a capacitance measurement signal to the capacitance measurement control and status circuit 60. The main control unit 64 also sends a signal to the reset circuit 76, which in turn resets the counter 74.

Upon receiving the capacitance measurement signal from the main control unit 64, the capacitance measurement control and status circuit 60 causes either the first or second voltage set point circuit 66, 68 to set the voltage provided by the backup power source 20 to 1 V below nominal regulation voltage. In the preferred embodiment of the present invention, the main control unit 64 controls which regulated output voltage is used (i.e.—either 33 V or 38 V) and sends a signal to the capacitance measurement voltage select circuit 62 that determines which voltage set point circuit 66, 68 is activated to drop the voltage provided by the backup power source 20 to 1 V below its nominal regulation value. Those skilled in the art should recognize that the use of a 1 V drop is by way of example only and should not be construed as a limitation of the present invention.

In addition to setting the regulation value of the backup power supply system 12 to 1 V below its nominal regulation value as set forth above, the main control unit 64 causes the load select circuit 80 to connect the first load 82 to the backup power source 20. This causes the voltage level on the backup power source 20 of the backup power supply system 12 to begin to drop due to the fact that the first load 82 is using energy stored in the backup power source 20 and the backup power supply system 12 has been set to a lower regulation valve therefore is allowing the voltage level to drop. In addition, the counter 74 is started by the capacitance measurement control and status circuit 60. As the voltage level of the backup power source 20 discharges through the first predetermined load 82, the counter 74 is keeping track of the time that elapses.

Once the regulated voltage level of the backup power source 20 drops 1 V below the nominal regulation value, the boost converter switching device 24 begins regulating the voltage level of the backup power source 20 so that the voltage on the backup power source 20 will remain at the newly set regulated output voltage, which as previously set forth, has been set by the first or second voltage set point circuit 66, 68 of the capacitance measurement system 10. When the backup power supply system 12 begins regulating, a signal is generated by a regulated voltage sensor 78 that is directed to the capacitance measurement control and status circuit 60, which causes the counter 74 to stop counting. Although not illustrated, in the preferred embodiment of the present invention the first count from the counter 74 is shifted into a register that stores the counted value. In the preferred embodiment of the present invention, the counter 74 is a 15-bit counter. Those skilled in the art would recognize that the count from the counter 74 as well as the status information provided from the capacitance measurement control and status circuit 60 could be directed to several different locations where the values are stored and used by the respective system using the capacitance measurement system 10.

After the first test has been completed and the first count value is obtained, a second test is performed on the backup power source 20 in order to determine the capacitance of the backup power source 20. In the second test, all of the above-referenced steps outlined in the first test are performed again except this time, instead of using the first load 82 to drop the voltage level on the backup power source 20 to 1 V below its nominal regulated output voltage, the second load 84 is used. In the preferred embodiment of the present invention, the second count from the counter 74 is then shifted out to the register, which stores the resulting value.

As a result of the above-referenced tests, the counter 74 results are reported to the main control unit 64. In the preferred embodiment of the present invention, the least significant bit of the 15-bit counter 74 is not mapped, which is the equivalent to a binary shift right or a division of 2. The main control unit 64 is used to calculate the capacitance of the backup power source 20 using the results obtained from the counter 74 from the first and second test. By using the results of the counter 74, and the known current values from the loads 82, 84, the main control unit 64 is capable of resolving the capacitance of the backup power source 20.

As set forth above, a differential measurement is used to measure the capacitance of the backup power source 20. In the preferred embodiment of the present invention, the formulas set forth below are generally used by the main control unit 64 to calculate the capacitance of the backup power source 20:

First Test:

$$I_1 = I_q + I_{basic} + I_{main} = C_{BPS} \times \Delta_{BPS}/CT_1 \times f_{fosc} \times 2$$

Second Test:

$$I_2 = I_q + I_{basic} + I_{main} = C_{BPS} \times \Delta_{BPS}/CT_2 \times f_{fosc} \times 2$$

Resolve for C_BPS:

$$C_{BPS} = I_{main} \times CT_1 \times CT_2/2 \times f_{fosc} \times \Delta_{BPS} \times (CT_1 - CT_2)$$

$\Delta_{BPS}$ : Fixed threshold of the backup power supply voltage drop (1 V in this preferred embodiment); and CTx: Capacitor counter content; must be multiplied by 2 (shift right counter content as set forth above).

Referring to FIG. 2, the preferred capacitance measurement control and status circuit 60 includes a first OR gate 90, a first flip-flop 92, a first AND gate 94, a second AND gate 96, a second OR gate 98 and a second flip-flop 100. As illustrated, the first OR gate 90 is preferentially a three-input OR gate 90 that has its inputs connected to the respective outputs of the regulated voltage sensor 78, the reset circuit 76 and a counter overflow output of the counter 74. The output of the first OR gate 90 is connected to an input of the first flip-flop 92. A non-inverting output of the first flip-flop 92 is connected to the capacitance measurement voltage select circuit 62 and the state machine 70. This output, together with an output signal from the main control unit 64, is used to set the regulated output voltage generated by the backup power source 20 to the predetermined regulated output voltage, which is below its nominal regulated output voltage value for testing. In addition, this output is used by the state machine 70 to start and stop the counter 74. In the preferred embodiment, the inverting output of the first flip-flop 92 is added to the results of the counter 74 and is used as the most significant bit of the counter output that is monitored by the main control unit 64 to keep track of the status of the capacitance measurement system 12.

The inputs of the first AND gate 94 of the capacitance measurement control and status circuit 60 is connected to a respective output of the main power monitor circuit 28 and a respective output of the main control unit 64. The inputs of the second AND gate 96 are connected to the output of the main control unit 64 and the counter overflow output of the counter 74. The output of the first AND gate 94 is connected to an input of the second OR gate 98 and the output of the second AND gate 96 is connected to another respective input of the second OR gate 98. The output of the second OR gate 98 is connected to an input of the second flip-flop 100 and a second input of the second flip-flop 100 is connected to the reset circuit 76. The non-inverting output of the second flip-flop 100 is added to the results of the counter 74 and is used as the second most significant bit of the counter output that is monitored by the main control unit 64 to keep track of the status of the capacitance measurement system 12.

As set forth above, during capacitance measurement mode, the capacitance measurement control and status circuit 60 is used to set the regulated output voltage generated by the backup power supply system 12 to a predetermined regulated output voltage level that is below its nominal operating value. In addition, the capacitance measurement control and status circuit 60 is used to start and stop the counter 74 once the regulated voltage sensor 78 senses that the boost converter switching device 24 of the backup power supply system 12 begins regulating. In the preferred embodiment, the boost converter switching device 24 begins regulating at the predetermined regulated output voltage of 1 V below the nominal regulated output voltage during test modes.

As set forth above, a feature provided by the capacitance measurement control and status circuit 60 is the fact that the respective outputs from the first and second flip-flops 92, 100 are used to generate status signals corresponding to the status of the capacitance measurement circuit 10. During operation, a low output from the inverting output of the first flip-flop 92 and a low output from the non-inverting output of the second flip-flop 100 indicates that the capacitance measurement system 10 is counting. If the respective output of the second flip-flop 100 is high, this indicates that the capacitance measurement system 10 has lost power from the main power source 16. A high output from the respective output of the first flip-flop 92 and a low output from the second flip-flop 100 indicates to the main control unit that the capacitance measurement system 10 is ready and if the output from the second flip-flop 100 goes high, this indicates that the capacitance measurement system 10 has experienced an error, such as an overflow from the counter 74.

Referring again to FIG. 2, the first voltage set point circuit 66 includes a first resistor 102 and a first DMOS transistor 104. The first resistor 102 is connected to a first predetermined point in the resistor divider chain 44 of the voltage regulator circuit 42 and the drain of the first DMOS transistor 104. The gate of the second DMOS transistor 104 is connected to an output of the capacitance measurement voltage select circuit 62 and the source of the first DMOS transistor 104 is connected to a second predetermined point in the resistor divider chain 44. As previously, set forth, in the preferred embodiment of the present invention, the first voltage set point circuit 66 is designed to drop the nominal regulated output voltage generated by the backup power supply system 12 from 38 V to 37 V in the preferred embodiment of the present invention.

The second voltage set point circuit 68 includes a second resistor 106 and a second DMOS transistor 108. The second resistor 106 is connected to the first predetermined point in the resistor divider chain 44 of the voltage regulator circuit 42 and the drain of the second DMOS transistor 108. The gate of the second DMOS transistor 108 is connected to a second output of the capacitance measurement voltage select circuit 62 and the source of the first DMOS transistor 104 is connected to a second predetermined point in the resistor divider chain 44. As previously set forth, in the preferred embodiment of the present invention the second voltage set point circuit 68 is designed to drop the nominal voltage generated by the backup power supply system 12 from 33 V to 32 V in the preferred embodiment of the present invention.

As set forth above, the nominal regulated output voltage generated by the backup power supply system 12 determines which respective voltage set point circuit 66, 68 will be activated during the capacitance measurement mode. Those skilled in the art should recognize that the capacitance measurement system 10 can be designed to only handle one nominal regulated output voltage, thereby eliminating the need for the capacitance measurement voltage select circuit 62. For example, the main control unit 64 or the first flip-flop 92 could be used activate a voltage set point circuit that drops the nominal regulated output voltage of the backup power supply system 12 a predetermined voltage level below its nominal regulated output voltage.

As illustrated in FIG. 2, the preferred reset circuit 76 includes an inverter 110 and an OR gate 112. Although not illustrated, the input of the inverter 110 may be connected to the main control unit 64 or another hardware device that is capable of providing a reset signal to the reset circuit 76. As such, resetting the capacitance measurement system 10 can either be controlled using software or hardware. The output of the inverter 110 is connected to a respective input of the first NOR gate 90 of the capacitance measurement control and status circuit 60, the state machine 70 and an input of the OR gate 112. A second input of the OR gate 112 is connected to an output of the state machine 70 and the output of the OR gate 112 is connected to a reset input of the counter 74. As such, the reset circuit 76 can be used to reset the counter 74 after a test has been completed or if an error has been detected in the capacitance measurement system 10.

The preferred voltage regulator sensor 78 of the capacitance measurement system 10 includes a reference voltage connection 114, a current source 116, a DMOS transistor 118 and an inverter 120. As illustrated in FIG. 2, the reference voltage connection 114 is connected to the current source 116, which is in turn, connected to the drain of the DMOS transistor 118. The source of the DMOS transistor 1 18 is connected to the ground connection 36 and the gate of the DMOS transistor 118 is connected to an output of the boost converter switching device 24. The drain of the DMOS transistor 118 is also connected to the input of inverter 120. The output of inverter 120 is connected to the capacitance measurement control and status circuit 60.

During operation, once the boost converter switching device 24 switches on to begin regulating the output voltage generated in the backup power source 20 at the predetermined regulated output voltage, a signal is sent from the output of inverter 120 to the capacitance measurement control and status circuit 60 that indicates that the counter 74 needs to be stopped. In response to this signal, the state machine 70 receives a signal from the capacitance measurement control and status circuit 60 that causes the state machine 70 to stop driving the counter 74.

While the present invention has been described with reference to specific exemplary embodiments, it will be evident that various modifications and changes may be made to these embodiments without departing from the broader scope of the invention as set forth in the claims. Accordingly, the specification and drawings are to be regarded in an illustrative rather than a restrictive sense.

What is claimed is:

1. A method of measuring a capacitance of a backup power source using a capacitance measuring system, comprising the steps of:

setting a regulated output voltage generated by said backup power source to a nominal regulated output voltage;

adjusting the backup power source to regulate at a predetermined regulated output voltage;

connecting a first predetermined load to said backup power source to dissipate energy from said backup power source;

starting a counter to generate a first count value corresponding to the amount of time that it takes for said backup power source to start regulating at said predetermined regulated output voltage;

stopping said counter once said regulated output voltage reaches said predetermined regulated output voltage and storing said first count value;

setting the regulated output voltage generated by said backup power source to said nominal regulated output voltage;

adjusting the backup power source to regulate the voltage provided by the backup power source to said predetermined regulated output voltage;

connecting a second predetermined load to said backup power source to dissipate energy from said backup power source;

starting said counter to generate a second count value corresponding to the amount of time that it takes for said backup power source to start regulating the regulated output voltage generated by the backup power source at the predetermined regulated output voltage;

stopping said counter once said regulated output voltage reaches said predetermined regulated output voltage and storing said second count value; and calculating the capacitance of said backup power source based on said first and second count values.

2. The method of claim 1, wherein a voltage set point circuit is used to adjust the backup power supply system to regulate the voltage provided by the backup power source to said predetermined regulated output voltage.

3. The method of claim 2, wherein a main control unit and a capacitance measurement control and status circuit are connected to said voltage set point circuit for controlling said voltage set point circuit.

4. The method of claim 1, wherein a main control unit and a load select circuit are used to connect said first and second predetermined loads to said backup power source.

5. The method of claim 1, wherein a capacitance measurement control and status circuit is connected to a state machine that controls said counter.

6. The method of claim 5, wherein an oscillator is connected to said state machine for driving said counter, said oscillator being set to a predetermined frequency that is used in calculating the capacitance of said backup power source.

7. The method of claim 1, wherein said first count value and said second count value are stored in a register that is connected to a main control unit and said counter.

8. The method of claim 1, further comprising the step of resetting said counter after each respective count value is stored with a reset circuit connected to said counter.

9. The method of claim 1, wherein a regulated output voltage sensor is connected to said backup power supply system and generates a predetermined output signal that is used to stop said counter.

10. The method of claim 9, wherein the output of said regulated output voltage sensor is connected to a capacitance measurement and control circuit that stops said counter.

11. The method of claim 9, wherein said regulated output voltage sensor comprises a reference voltage, a current source, a DMOS transistor and an inverter.

12. The method of claim 1, further comprising the step of supplying a capacitance measurement control and monitoring circuit for monitoring the status of said capacitance measurement system.

13. The method of claim 12, wherein said capacitance measurement control and monitoring circuit is connected to a main control unit for providing a plurality of predetermined status signals to said main control unit.

14. The method of claim 12, wherein said capacitance measurement control and monitoring circuit comprises a first OR gate, a first flip-flop, a first AND gate, a second AND gate, a second OR gate and a second flip-flop.

15. The method of claim 14, wherein respective outputs of each said flip-flop are used to generate status signals during operation of said capacitance measurement system.

16. A capacitance measurement system for a backup power supply system including a backup power source that is capable of providing a regulated output voltage, comprising:
   a voltage set point circuit connected to said backup power source operable to set said backup power source to operate at a lower regulated output voltage than a nominal regulated output voltage;
   a capacitance measurement control and status circuit connected to said voltage set point circuit for controlling said voltage set point circuit;
   a counter connected to said capacitance measurement control and status circuit; and
   a regulated output voltage sensor connected to said backup power supply system for determining when said backup power source reaches said lower regulated output voltage during a capacitance measurement test; and
   wherein said capacitance measurement test comprises the steps of:
      setting said backup power source to operate at said lower regulated output voltage than said nominal regulated output voltage;
      applying a first predetermined load to said backup power source to lower said regulated output voltage from said nominal regulated output voltage to said lower regulated output voltage;
      starting said counter to generate a first count value corresponding to the amount of time it takes to lower said regulated output voltage from said nominal regulated output voltage to said lower regulated output voltage;
      stopping said counter with an output signal from a regulated voltage sensor connected to said counter and said backup power supply once said lower regulated output voltage is reached;
      setting said backup power source to operate at said nominal regulated output voltage until said backup power source reaches said nominal regulated output voltage;
      setting said backup power source to operate at said lower regulated output voltage;
      applying a second predetermined load to said backup power source to lower said regulated output voltage from said nominal regulated output voltage to said lower regulated output voltage;
      starting said counter to generate a second count value corresponding to the amount of time it takes to lower said regulated output voltage from said nominal regulated output voltage to said lower regulated output voltage;
      stopping said counter with an output signal from the regulated voltage sensor once said lower regulated output voltage is reached; and
      using said first count value and said second count value to calculate the capacitance of said backup power source.

17. The capacitance measurement system of claim 16, further comprising a main control unit and a capacitance measurement control and status circuit connected to said voltage set point circuit for controlling said voltage set point circuit.

18. The capacitance measurement system of claim 16, further comprising a main control unit connected to a load select circuit that is used to connect said first and second predetermined loads to said backup power source.

19. The capacitance measurement system of claim 16, further comprising a capacitance measurement control and status circuit connected to a state machine that controls said counter.

20. The capacitance measurement system of claim 19, further comprising an oscillator connected to said state machine for driving said counter, said oscillator being set to a predetermined frequency that is used in calculating the capacitance of said backup power source.

21. The capacitance measurement system of claim 16, wherein said first count value and said second count value are stored in a register that is connected to a main control unit and said counter.

22. The capacitance measurement system of claim 16, further comprising a reset circuit connected to said counter.

23. The capacitance measurement system of claim 16, further comprising a regulated output voltage sensor connected to said backup power supply system for generating a predetermined output signal that is used to stop said counter.

24. The capacitance measurement system of claim 23, wherein the output of said regulated output voltage sensor is connected to said capacitance measurement and control circuit which is operable to stop said counter.

25. The capacitance measurement system of claim 23, wherein said regulated output voltage sensor comprises a reference voltage, a current source, a DMOS transistor and an inverter.

26. The capacitance measurement system of claim 16, further comprising a capacitance measurement control and monitoring circuit for monitoring the status of said capacitance measurement system.

27. The capacitance measurement system of claim 26, wherein said capacitance measurement control and monitoring circuit is connected to a main control unit and is operable to provide a plurality of predetermined status signals to said main control unit.

28. A method for measuring a capacitance of a backup power supply system having a regulated output voltage, comprising the steps of:

provide a first regulated output voltage from a backup power source in said backup power supply system;

sending a capacitance measurement signal to a capacitance measurement control and status circuit with a main control unit connected to said capacitance measurement control and status circuit;

adjusting the regulated set point of said backup power supply system to a second regulated output voltage with a voltage set point circuit connected to said capacitance measurement control and status circuit;

applying a first load to said backup power source for discharging energy from said backup power source thereby causing said regulated output voltage to begin to drop to said second regulated output voltage;

sensing when said regulated output voltage reaches said second regulated output voltage with a regulated output voltage sensor connected to said backup power supply system;

obtaining a first test result based on the amount of time that elapses for said regulated output voltage to reach said second regulated output voltage once said first load is applied to said backup power source with a counter connected to said boost converter switching device and said capacitance measurement control and status circuit;

resetting said backup power source to operate at said first regulated output voltage;

adjusting said backup power supply system to operate at said second regulated output voltage with said voltage set point circuit;

applying a second load to said backup power source for discharging energy from said backup power source thereby causing said regulated output voltage to begin to drop to said second regulated output voltage;

sensing when said regulated output voltage reaches said second regulated output voltage with said regulated output voltage sensor; and obtaining a second test result based on the amount of time that elapses for said regulated output voltage to reach said second regulated output voltage once said second load is applied to said backup power source with said counter; and calculating the capacitance of said backup power source with said first test result and said second test result.

\* \* \* \* \*